(12) United States Patent
Tanaka et al.

(10) Patent No.: US 11,856,826 B2
(45) Date of Patent: Dec. 26, 2023

(54) DISPLAY DEVICE

(71) Applicant: Samsung Display Co., Ltd., Yongin-Si (KR)

(72) Inventors: Tetsuhiro Tanaka, Hwaseong-si (KR); Yeong-Gyu Kim, Seoul (KR); Kiseong Seo, Seoul (KR); Jonghyun Yun, Suwon-si (KR); Seunghyun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 132 days.

(21) Appl. No.: 17/336,365

(22) Filed: Jun. 2, 2021

(65) Prior Publication Data

US 2021/0384282 A1 Dec. 9, 2021

(30) Foreign Application Priority Data

Jun. 5, 2020 (KR) ........................ 10-2020-0068417

(51) Int. Cl.
*H10K 59/121* (2023.01)
*H10K 59/131* (2023.01)
*H01L 27/12* (2006.01)

(52) U.S. Cl.
CPC ....... *H10K 59/131* (2023.02); *H10K 59/1213* (2023.02); *H10K 59/1216* (2023.02); *H01L 27/1214* (2013.01)

(58) Field of Classification Search
CPC ............. H10K 59/131; H10K 59/1213; H10K 59/1216; H10K 59/1315; H10K 59/12; H10K 59/123; H01L 27/1214; H01L 27/3262; H01L 27/3279; H01L 27/3244
See application file for complete search history.

(56) References Cited

U.S. PATENT DOCUMENTS

| | | | | |
|---|---|---|---|---|
| 2006/0243976 | A1* | 11/2006 | Hyun-Eok | H10K 59/12 |
| 2011/0175535 | A1* | 7/2011 | Makita | G02F 1/1368 |
| | | | | 438/164 |
| 2013/0302924 | A1* | 11/2013 | Yamazaki | H01L 27/1251 |
| 2015/0021592 | A1* | 1/2015 | Seo | H01L 27/1259 |
| 2015/0069336 | A1* | 3/2015 | Okumura | H01L 29/7869 |
| | | | | 257/43 |
| 2019/0027092 | A1* | 1/2019 | Matsueda | G09G 3/3233 |
| 2019/0252479 | A1* | 8/2019 | Kang | H10K 59/1216 |
| 2020/0326571 | A1* | 10/2020 | Hanada | H10K 59/126 |

FOREIGN PATENT DOCUMENTS

| KR | 10-0858088 B1 | 9/2008 | | |
|---|---|---|---|---|
| KR | 20190044159 A | * | 4/2019 | ........... G02F 1/1368 |
| KR | 10-2019-0098315 A | | 8/2019 | |

OTHER PUBLICATIONS

Translation of KR 20190044159 A; Lee H. (Year: 2019).*

* cited by examiner

*Primary Examiner* — Mark W Tornow
*Assistant Examiner* — Halee Cramer
(74) *Attorney, Agent, or Firm* — Innovation Counsel LLP

(57) ABSTRACT

A display device may include a first active layer disposed on a substrate, a scan line disposed on the first active layer, a lower gate signal line disposed on the scan line, an oxide semiconductor pattern disposed on the lower gate signal line, and including a channel part that overlaps the lower gate signal line and a low-resistance part formed on a side portion of the channel part, a metal pattern disposed on at least one surface of the low-resistance part, and an upper gate signal line disposed on the oxide semiconductor pattern to overlap the channel part.

17 Claims, 21 Drawing Sheets

FIG. 3
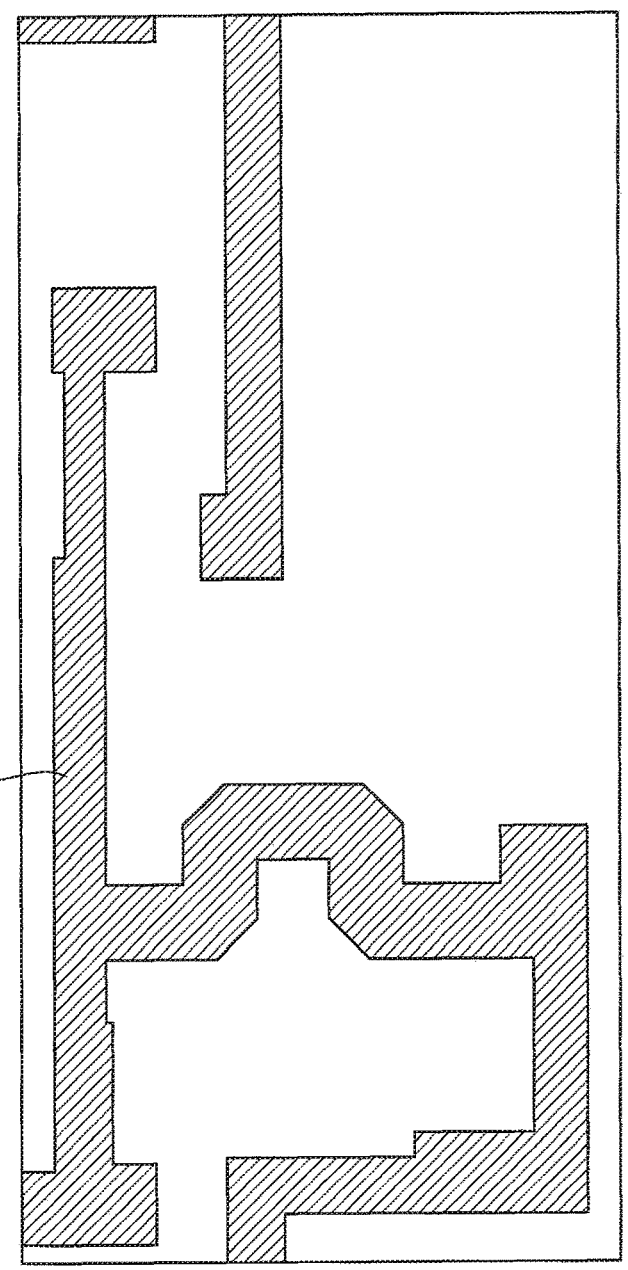
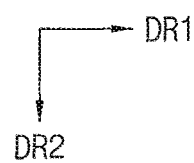

FIG. 5
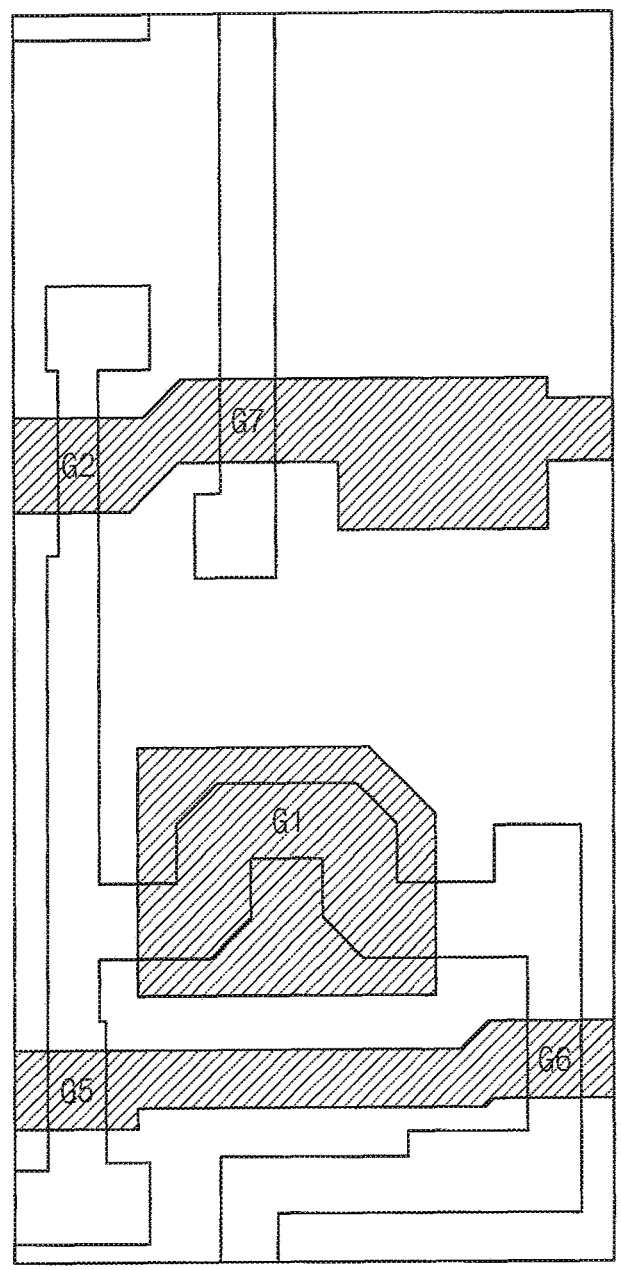
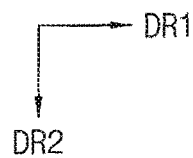

FIG. 6
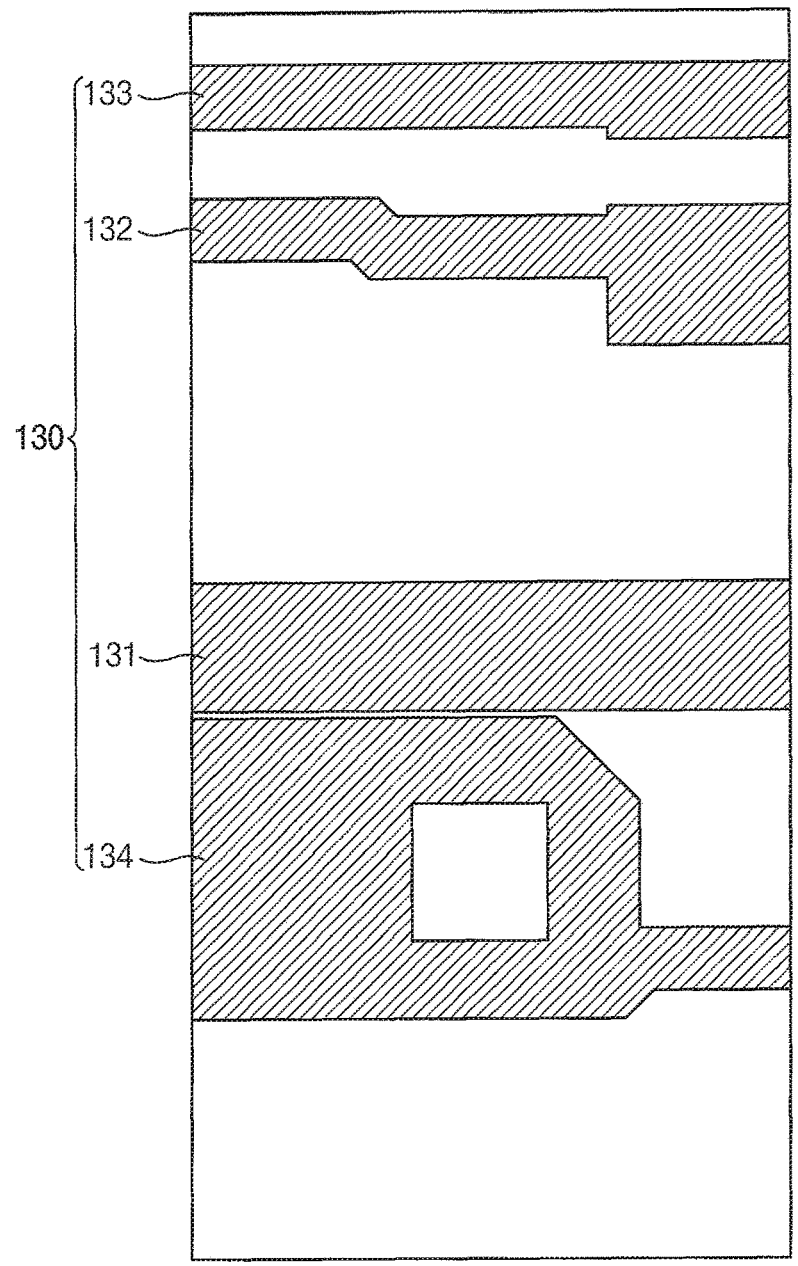
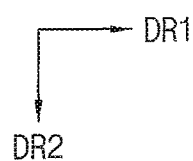

FIG. 7
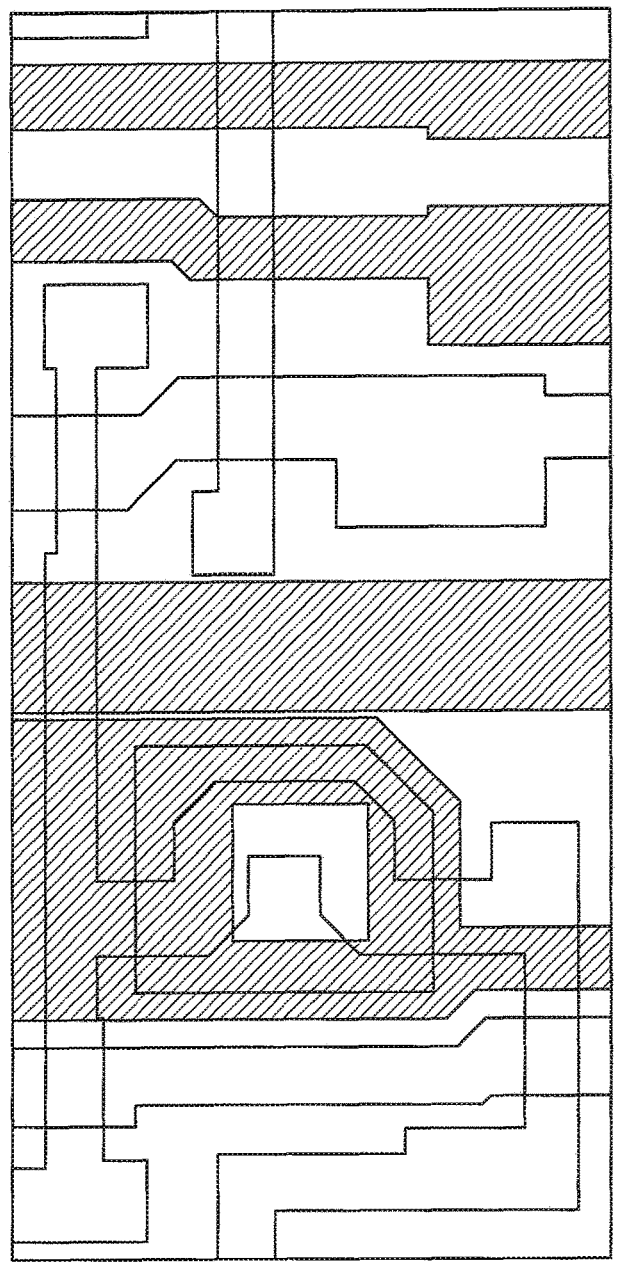
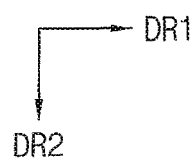

FIG. 8
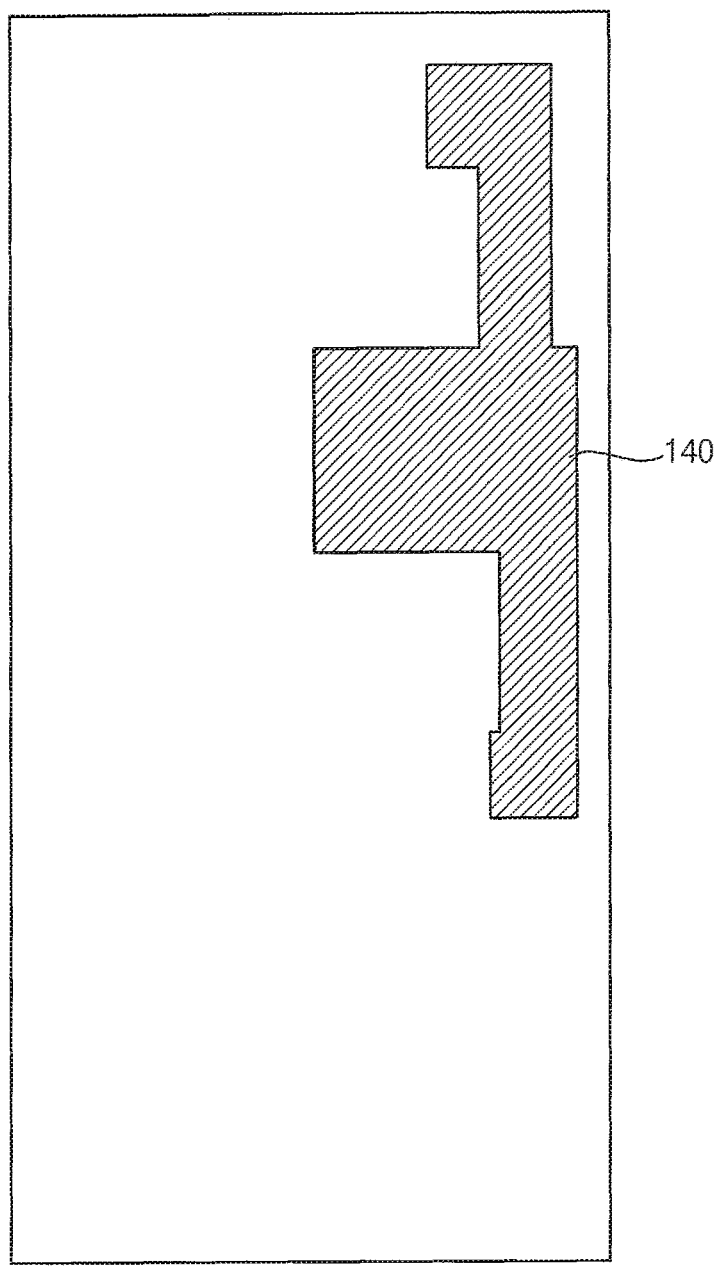
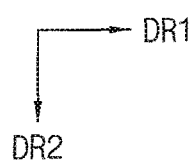

FIG. 9
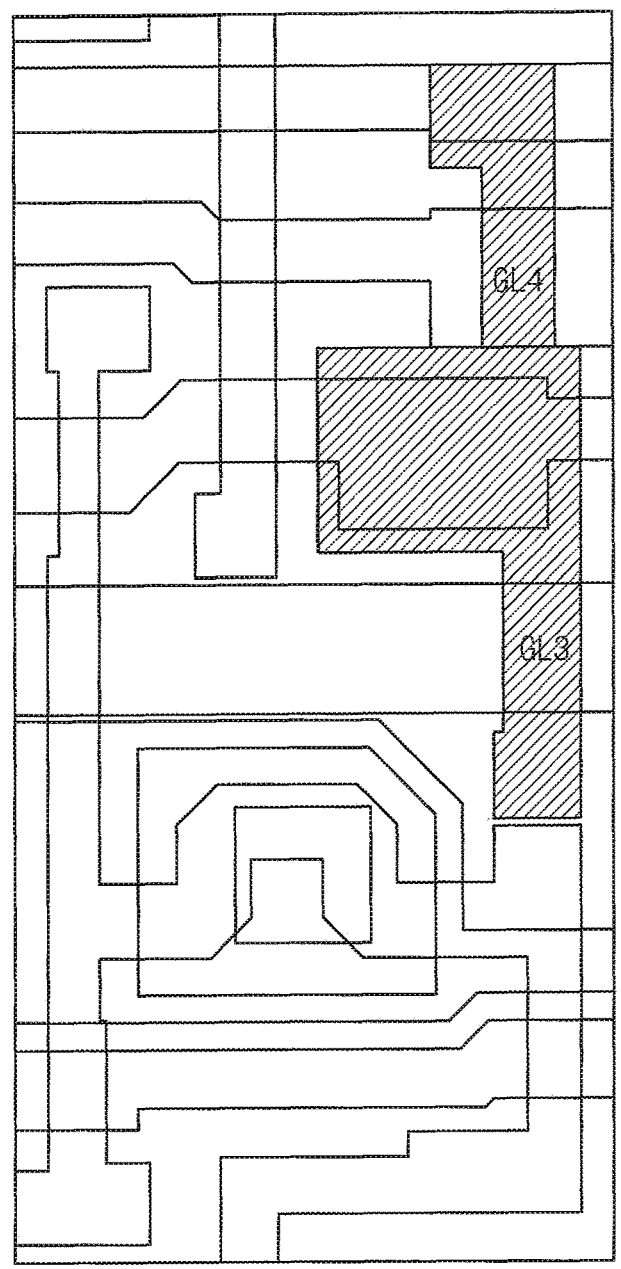
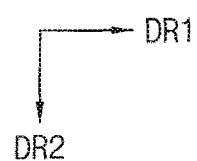

FIG. 11
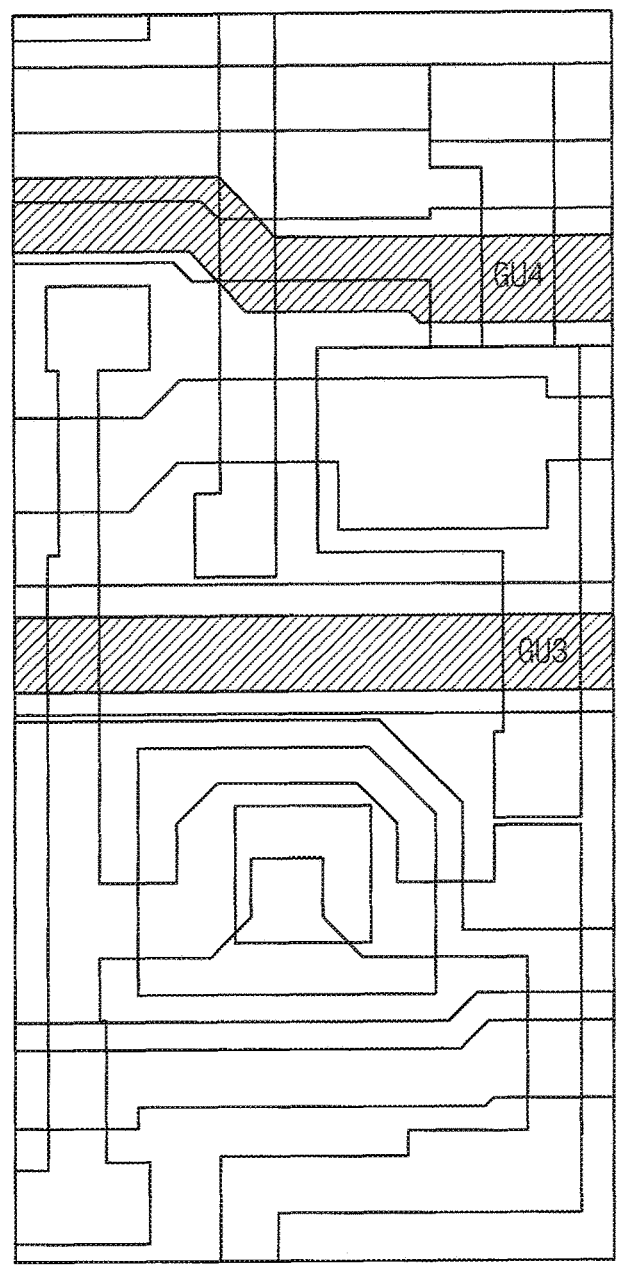
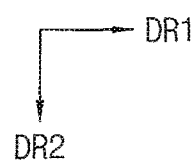

FIG. 15
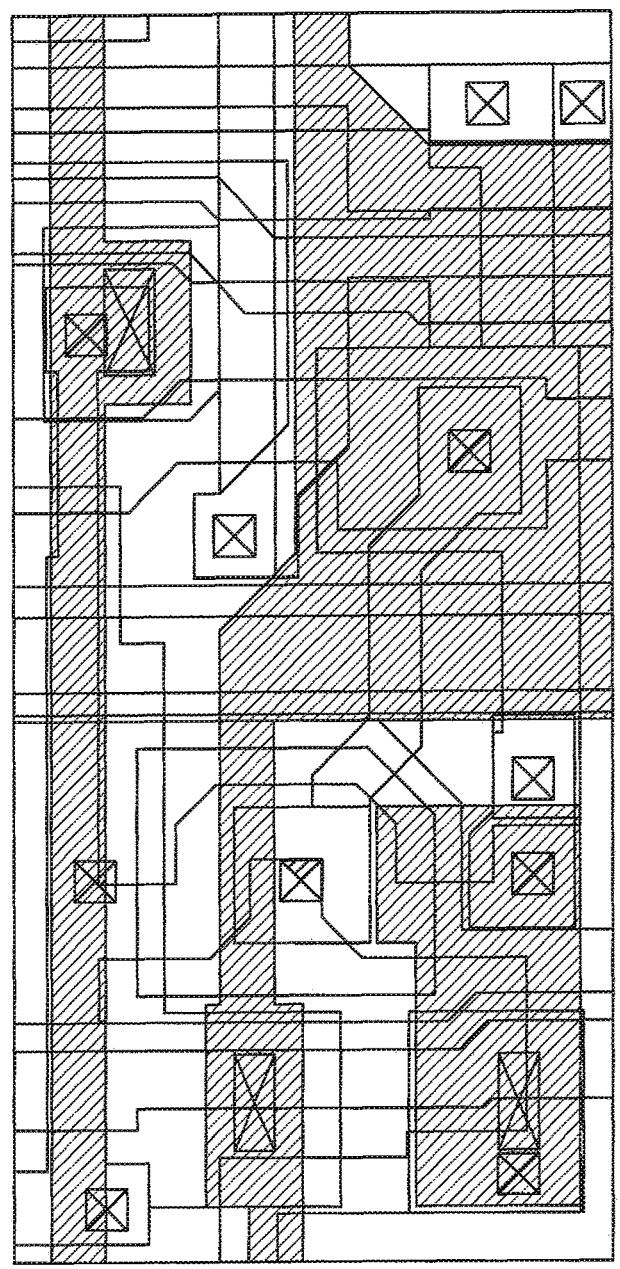
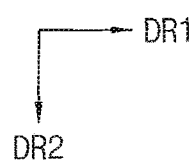

FIG. 19
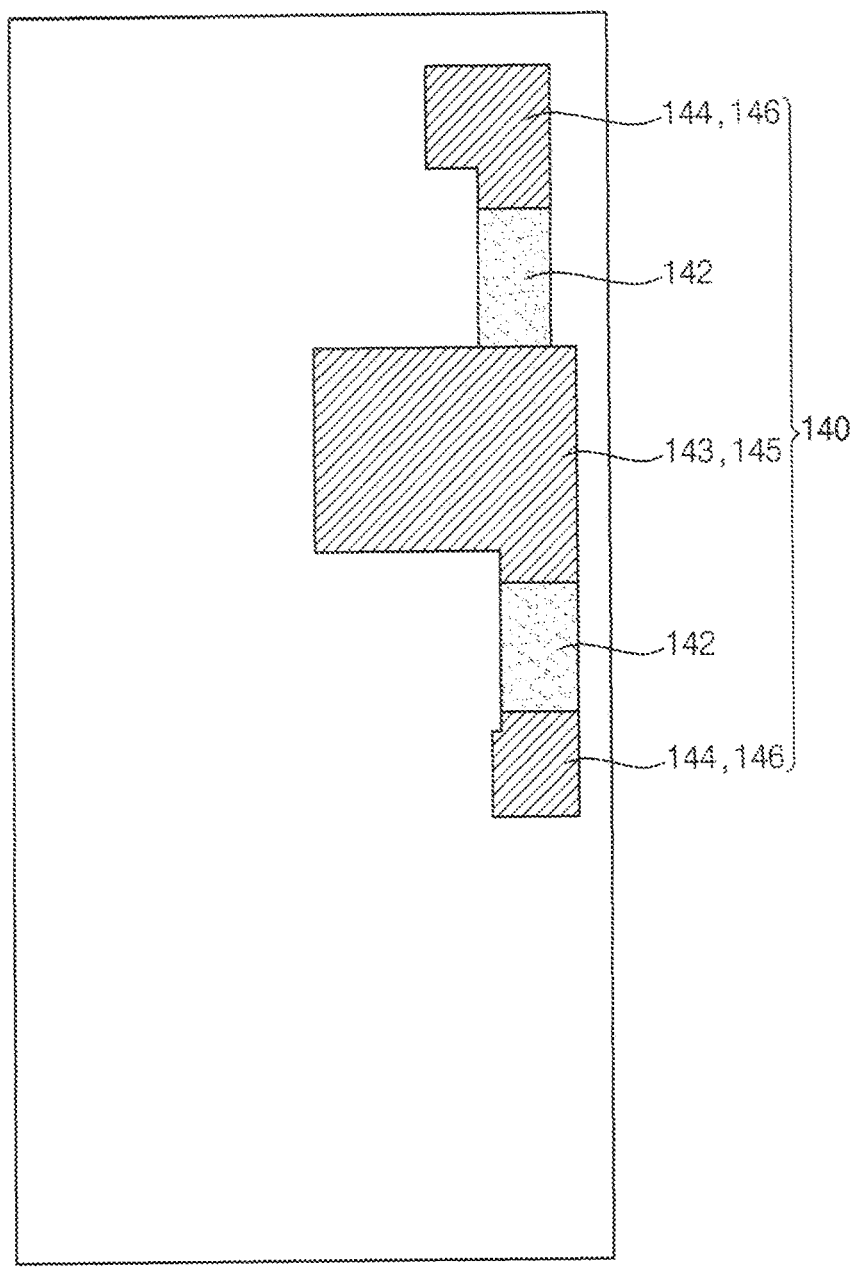
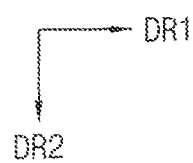

DISPLAY DEVICE

CROSS-REFERENCE TO RELATED APPLICATION

This application claims priority under 35 USC § 119 to Korean Patent Application No. 10-2020-0068417 filed on Jun. 5, 2020, in the Korean Intellectual Property Office (KIPO), the entire disclosure of which is incorporated herein by reference.

BACKGROUND

1. Field

Embodiments relate to a display device.

2. Description of the Related Art

A display device is a device displaying an image for providing visual information to a user. The display device may include a plurality of pixels. Each of the pixels may include a light emitting element configured to generate light and a pixel circuit configured to provide a driving current to the light emitting element. The pixel circuit may include a plurality of active layers for forming a plurality of transistors.

The active layers may include a first active layer, an oxide semiconductor pattern, and the like. Meanwhile, when a resistance of the oxide semiconductor pattern increases, an ON-state current of a transistor including the oxide semiconductor pattern may be reduced.

SUMMARY

Embodiments provide a display device in which a resistance of an oxide semiconductor pattern decreases.

A display device according to one embodiment may include a first active layer disposed on a substrate, a scan line disposed on the first active layer, a lower gate signal line disposed on the scan line, a second active layer disposed on the lower gate signal line, the second active layer including an oxide semiconductor pattern that includes a channel overlapping the lower gate signal line and a low-resistance part formed on a side portion of the channel, a metal pattern disposed on at least one surface of the low-resistance part, and an upper gate signal line disposed on the second active layer to overlap the channel.

In one embodiment, the metal pattern may make direct contact with the at least one surface of the low-resistance part.

In one embodiment, the scan line and the low-resistance part may form a boost capacitor.

In one embodiment, the metal pattern may include at least one of tungsten (W), titanium (Ti), molybdenum (Mo), aluminum (Al), tantalum (Ta), and a nitride thereof.

In one embodiment, the metal pattern may include oxygen atoms or oxygen ions diffused from the oxide semiconductor pattern.

In one embodiment, an oxygen content of the low-resistance part may be smaller than an oxygen content of the channel.

In one embodiment, a thickness of the metal pattern may be about 50 Å or more and about 1000 Å or less.

In one embodiment, the metal pattern may be disposed on a top surface of the low-resistance part.

In one embodiment, the metal pattern may be disposed on a bottom surface of the low-resistance part.

In one embodiment, the low-resistance part may include a first low-resistance part formed on a first side portion of the channel and a second low-resistance part formed on a second side portion of the channel, which is spaced apart from the first side portion of the channel with the channel interposed therebetween, and the metal pattern may include a first metal pattern disposed on at least one surface of the first low-resistance part and a second metal pattern disposed on at least one surface of the second low-resistance part.

In one embodiment, the display device may further include a first conductive pattern disposed on a same layer as the scan line to form a driving transistor together with the first active layer.

In one embodiment, the first low-resistance part may be electrically connected to the first conductive pattern.

In one embodiment, the display device may further include a second conductive pattern disposed on a same layer as the lower gate signal line to form a storage capacitor together with the first conductive pattern.

In one embodiment, the first low-resistance part may extend to overlap the second conductive pattern, and the second conductive pattern and the first low-resistance part may form the storage capacitor.

In one embodiment, the second low-resistance part may be electrically connected to the first active layer.

In one embodiment, a gap between the first metal pattern and the second metal pattern may be smaller than a width of the upper gate signal line.

In one embodiment, the gap between the first metal pattern and the second metal pattern may be greater than about 0.1 µm.

A display device according to one embodiment may include a driving transistor including a first active layer disposed on a substrate, and a gate electrode disposed on the first active layer, a scan line disposed on a same layer as the gate electrode, and a compensation transistor including a lower gate electrode disposed on the scan line, a second active layer, the second active layer including a channel disposed on the lower gate electrode to overlap the lower gate electrode and a low-resistance part formed on a side portion of the channel, a metal pattern disposed on at least one surface of the low-resistance part, and an upper gate electrode disposed on the second active layer to overlap the channel.

In one embodiment, the metal pattern may make direct contact with the at least one surface of the low-resistance part.

In one embodiment, the scan line and the low-resistance part may form a boost capacitor.

The display device according to the embodiments may include the metal pattern disposed on at least one surface of the low-resistance part of the oxide semiconductor pattern, so that the low-resistance part may include a relatively large amount of oxygen vacancy and a resistance of the low-resistance part may decrease. Accordingly, reduction of the ON-state current of the compensation transistor including the oxide semiconductor pattern may be prevented.

BRIEF DESCRIPTION OF THE DRAWINGS

Illustrative, non-limiting embodiments will be more clearly understood from the following detailed description taken in conjunction with the accompanying drawings.

FIGS. 3, 4, 5, 6, 7, 8, 9, 10, 11, 12, 13, 14, and 15 are layout views showing the pixel of FIG. 2.

FIGS. 19 and 20 are layout views showing a pixel according to one embodiment of the present inventive concept.

DETAILED DESCRIPTION OF THE EMBODIMENTS

Hereinafter, display devices in accordance with embodiments will be explained in detail with reference to the accompanying drawings.

Figure 1:
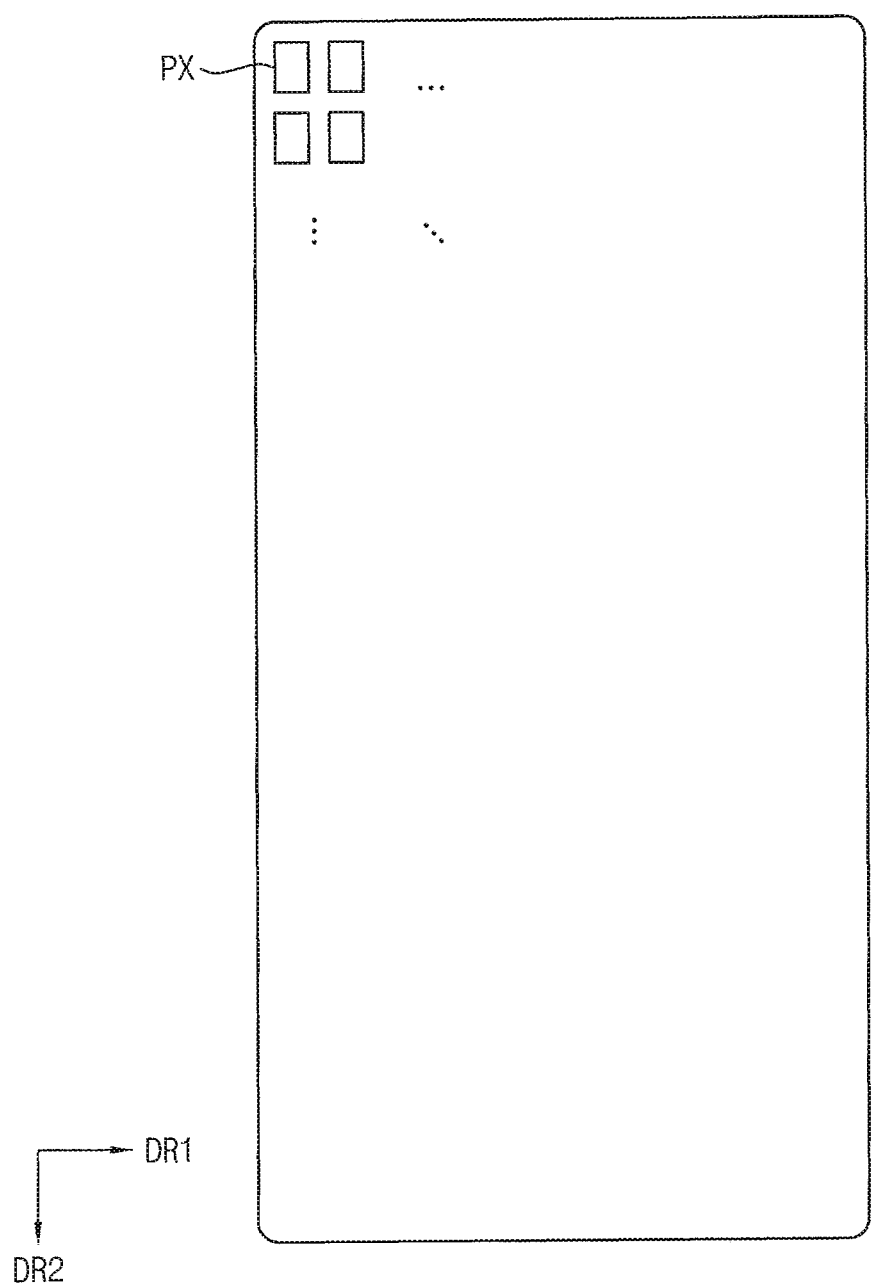
FIG. 1 is a plan view showing a display device according to one embodiment of the present inventive concept.

FIG. 1 is a plan view showing a display device according to one embodiment of the present inventive concept.

Referring to FIG. 1, according to one embodiment of the present inventive concept, a display device may include a plurality of pixels PX. Each of the pixels PX refers to the smallest addressable imaging element which displays one of primary colors. In other words, one pixel PX may be a minimum unit capable of displaying a color independently from other pixels PX. The pixels PX may be arranged in a first direction DR1 and a second direction DR2 intersecting the first direction DR1.

Figure 2:
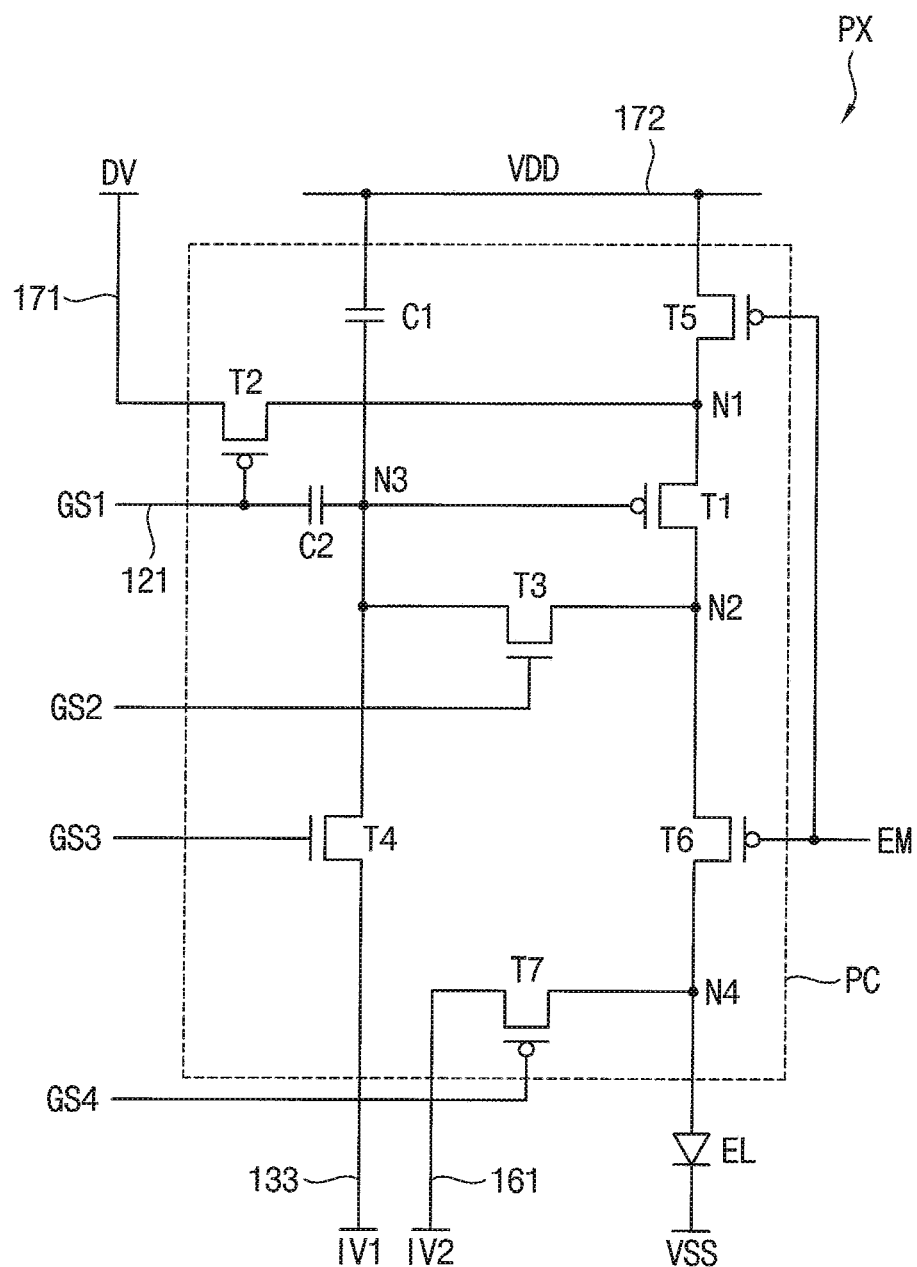
FIG. 2 is a circuit diagram showing a pixel according to one embodiment of the present inventive concept.
Figure 4:
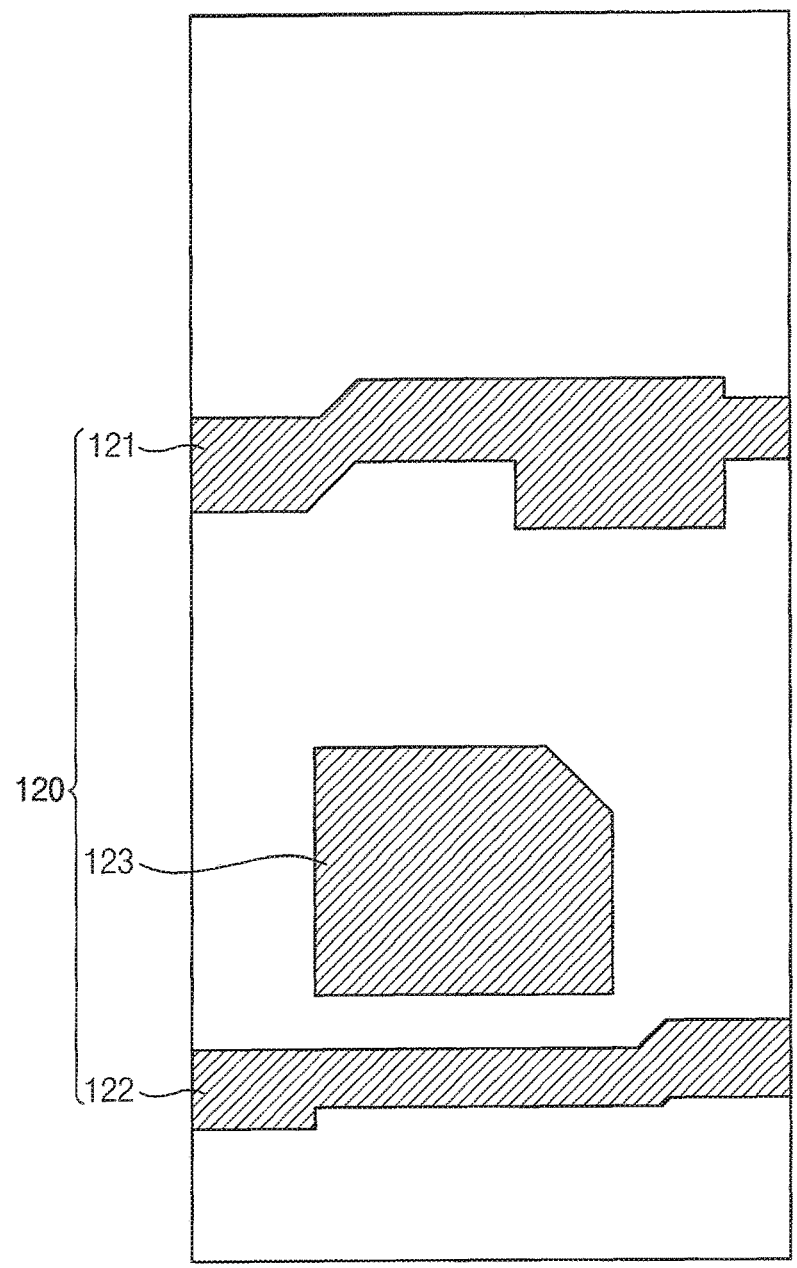
Figure 10:
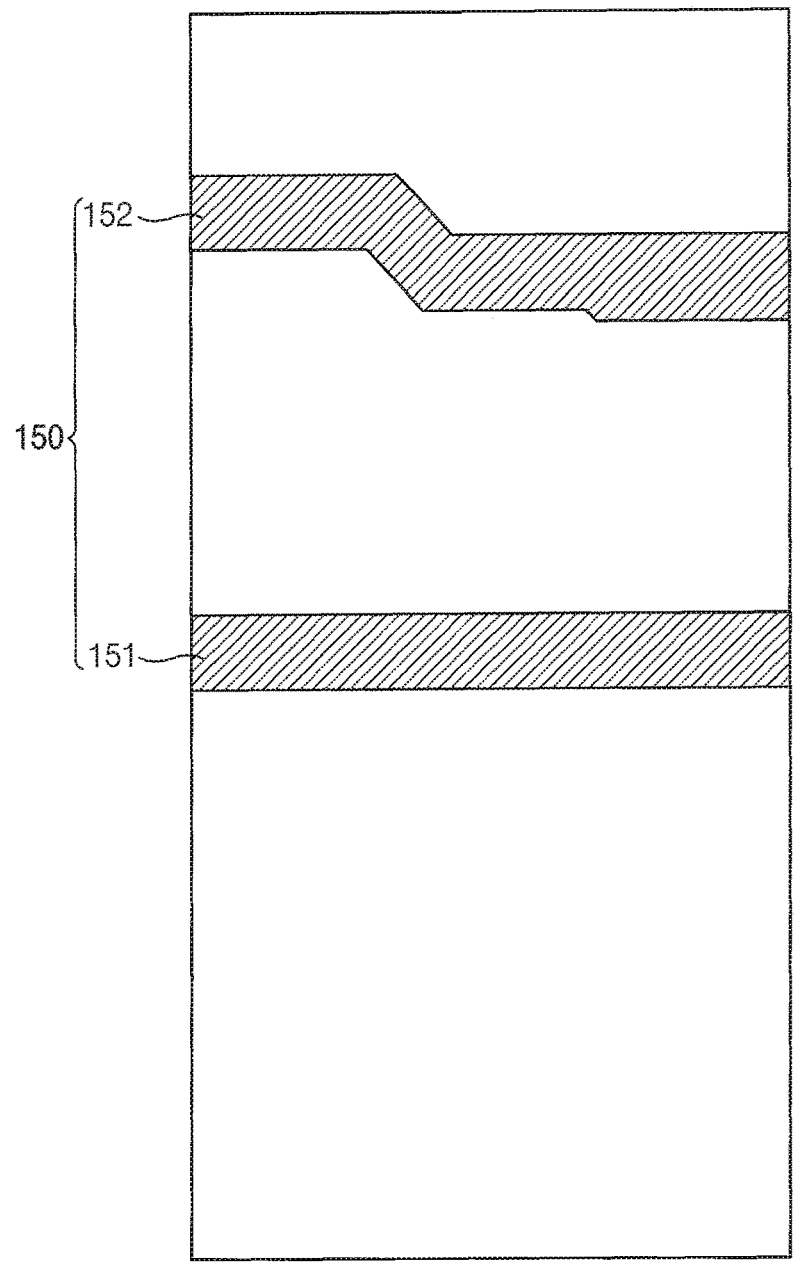
Figure 12:
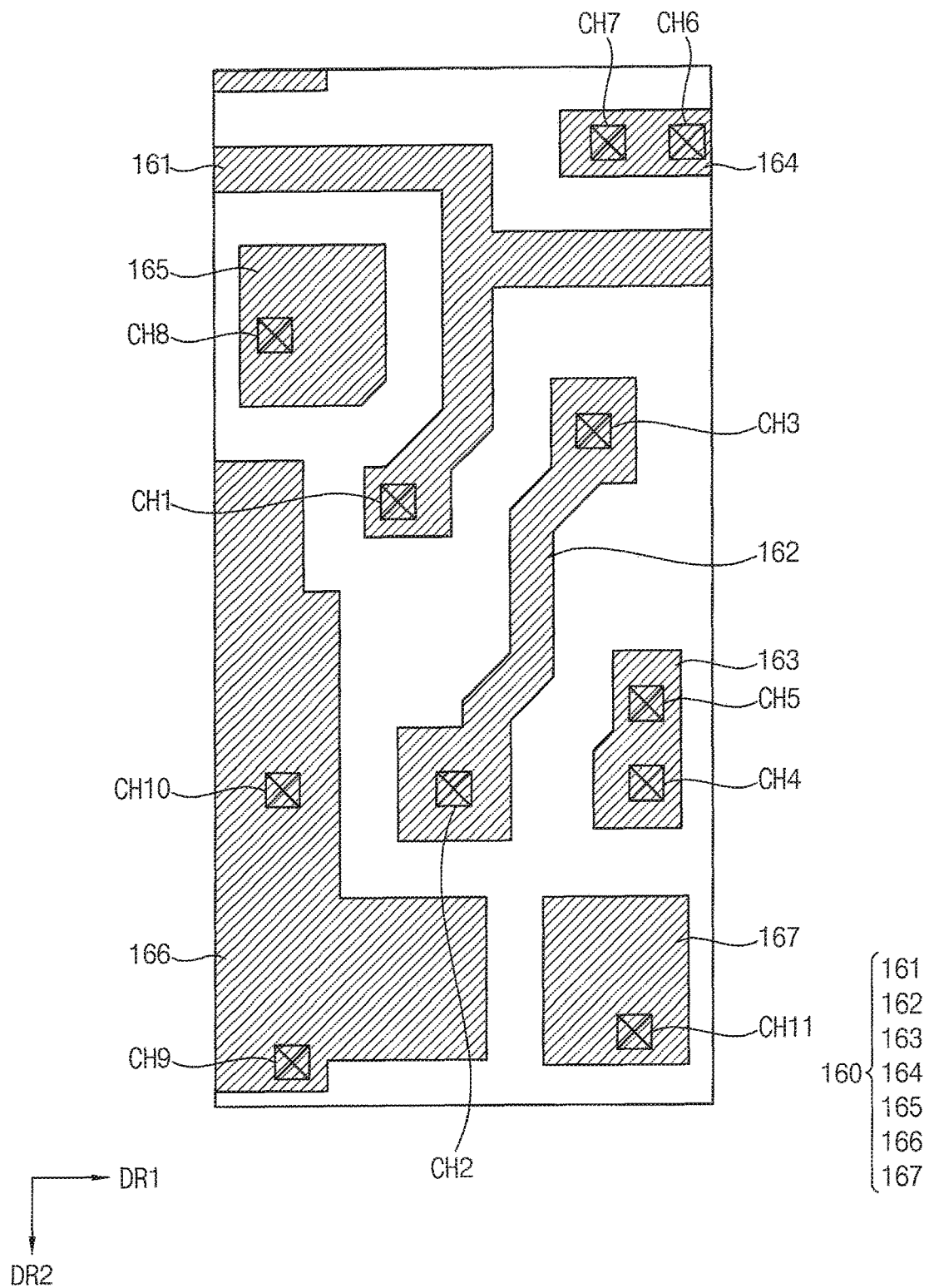

FIG. 2 is a circuit diagram showing a pixel PX according to one embodiment of the present inventive concept.

Referring to FIG. 2, according to one embodiment of the present inventive concept, the pixel PX may include a pixel circuit PC and a light emitting element EL. The pixel circuit PC may provide a driving current to the light emitting element EL. The light emitting element EL may emit light based on the driving current provided from the pixel circuit PC. The pixel circuit PC may include at least one transistor and at least one capacitor to generate the driving current.

In one embodiment, the pixel circuit PC may include a driving transistor T1, a switching transistor T2, a compensation transistor T3, a first initialization transistor T4, a first emission control transistor T5, a second emission control transistor T6, a second initialization transistor T7, a storage capacitor C1, and a boost capacitor C2, but the present inventive concept is not limited thereto. In another embodiment, the pixel circuit PC may include two to six transistors or eight or more transistors and/or one capacitor or three or more capacitors.

The driving transistor T1 may be connected between a first node N1 and a second node N2. A gate electrode of the driving transistor T1 may be connected to a third node N3. The driving transistor T1 may generate the driving current in proportional to a voltage difference between the first node N1 and the third node N3.

The switching transistor T2 may be connected between a data line 171 and the first node N1. A gate electrode of the switching transistor T2 may receive a first gate signal GS1 from a scan line 121. The switching transistor T2 may receive a data voltage DV from the data line 171 and transmit the data voltage DV to the first node N1 in response to the first gate signal GS1.

The compensation transistor T3 may be connected between the second node N2 and the third node N3. A gate electrode of the compensation transistor T3 may receive a second gate signal GS2. The compensation transistor T3 may connect the second node N2 to the third node N3 in response to the second gate signal GS2 so as to compensate for a threshold voltage of the driving transistor T1.

The first initialization transistor T4 may be connected between a first initialization voltage line 133 and the third node N3. A gate electrode of the first initialization transistor T4 may receive a third gate signal GS3. In one embodiment, when the pixel PX is included in an $N^{th}$ pixel row, the third gate signal GS3 may be a first gate signal applied to an $(N-1)^{th}$ pixel row. The first initialization transistor T4 may receive a first initialization voltage IV1 from the first initialization voltage line 133 and transmit the first initialization voltage IV1 to the third node N3 in response to the third gate signal GS3 so as to initialize the third node N3.

The first emission control transistor T5 may be connected between a power supply voltage line 172 and the first node N1. A gate electrode of the first emission control transistor T5 may receive an emission control signal EM. The power supply voltage line 172 may transmit a first power supply voltage VDD from a first power source.

The second emission control transistor T6 may be connected between the second node N2 and a fourth node N4. A gate electrode of the second emission control transistor T6 may receive the emission control signal EM. The first emission control transistor T5 and the second emission control transistor T6 may transmit the driving current generated from the driving transistor T1 to the light emitting element EL in response to the emission control signal EM.

The second initialization transistor T7 may be connected between a second initialization voltage line 161 and the fourth node N4. A gate electrode of the second initialization transistor T7 may receive a fourth gate signal GS4. In one embodiment, when the pixel PX is included in the $N^{th}$ pixel row, the fourth gate signal GS4 may be a gate signal applied to an $(N+1)^{th}$ pixel row. The second initialization transistor T7 may receive a second initialization voltage IV2 from the second initialization voltage line 161 and transmit the second initialization voltage IV2 to the fourth node N4 in response to the fourth gate signal GS4 so as to initialize the fourth node N4.

In one embodiment, each of the driving transistor T1, the switching transistor T2, the first emission control transistor T5, the second emission control transistor T6, and the second initialization transistor T7 may be a transistor having a single gate structure, and each of the compensation transistor T3 and the first initialization transistor T4 may be a transistor having a double gate structure. In this case, the gate electrode of each of the compensation transistor T3 and the first initialization transistor T4 may be a dual gate electrode that includes a lower gate electrode and an upper gate electrode, and the lower gate electrode and the upper gate electrode may be electrically connected to each other.

In one embodiment, each of the driving transistor T1, the switching transistor T2, the first emission control transistor T5, the second emission control transistor T6, and the second initialization transistor T7 may include a first active layer, and each of the compensation transistor T3 and the first initialization transistor T4 may include an oxide semiconductor pattern. In one embodiment, each of the driving transistor T1, the switching transistor T2, the first emission control transistor T5, the second emission control transistor T6, and the second initialization transistor T7 may be a PMOS, and each of the compensation transistor T3 and the first initialization transistor T4 may be an NMOS.

The storage capacitor C1 may be connected between the power supply voltage line 172 and the third node N3. The storage capacitor C1 may maintain the voltage between the first node N1 and the third node N3 even when the switching transistor T2 is turned off, so that the light emitting element EL may emit the light.

The boost capacitor C2 may be connected between the scan line 121 and the third node N3. The boost capacitor C2 may boost a voltage level of the gate electrode of the driving transistor T1.

The light emitting element EL may be connected between the fourth node N4 and a second power source. The second power source may provide a second power supply voltage VSS. In one embodiment, the second power supply voltage VSS may be lower than the first power supply voltage VDD. The light emitting element EL may emit the light in response to the driving current transmitted from the pixel circuit PC.

Figure 13:
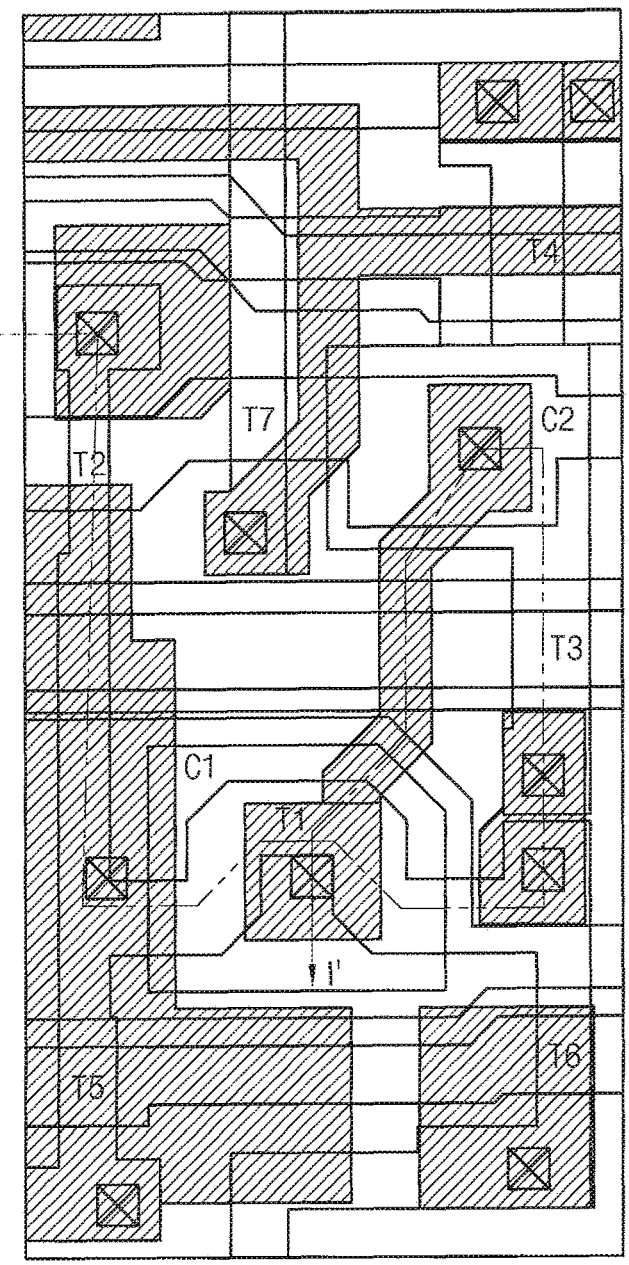
Figure 14:
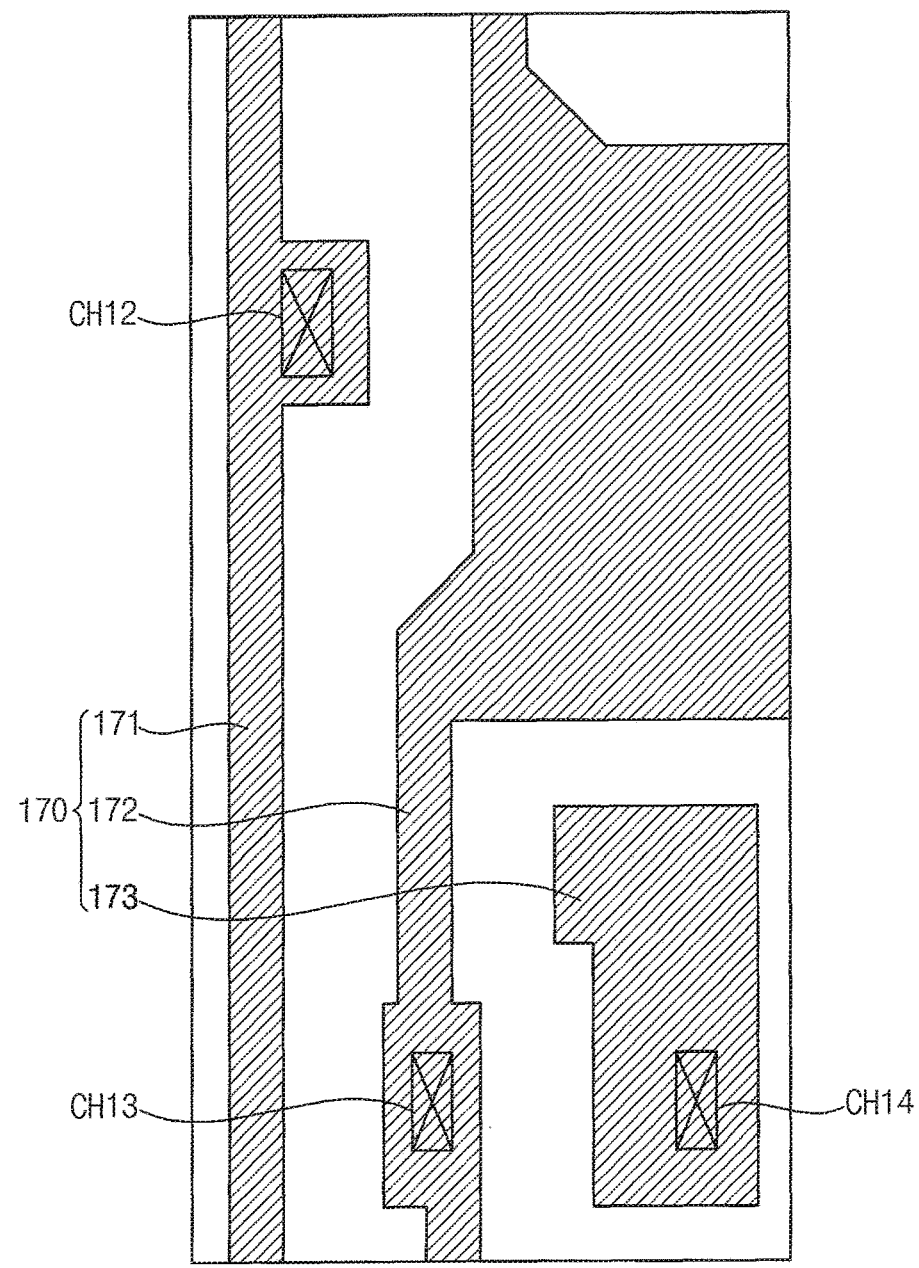
Figure 16:
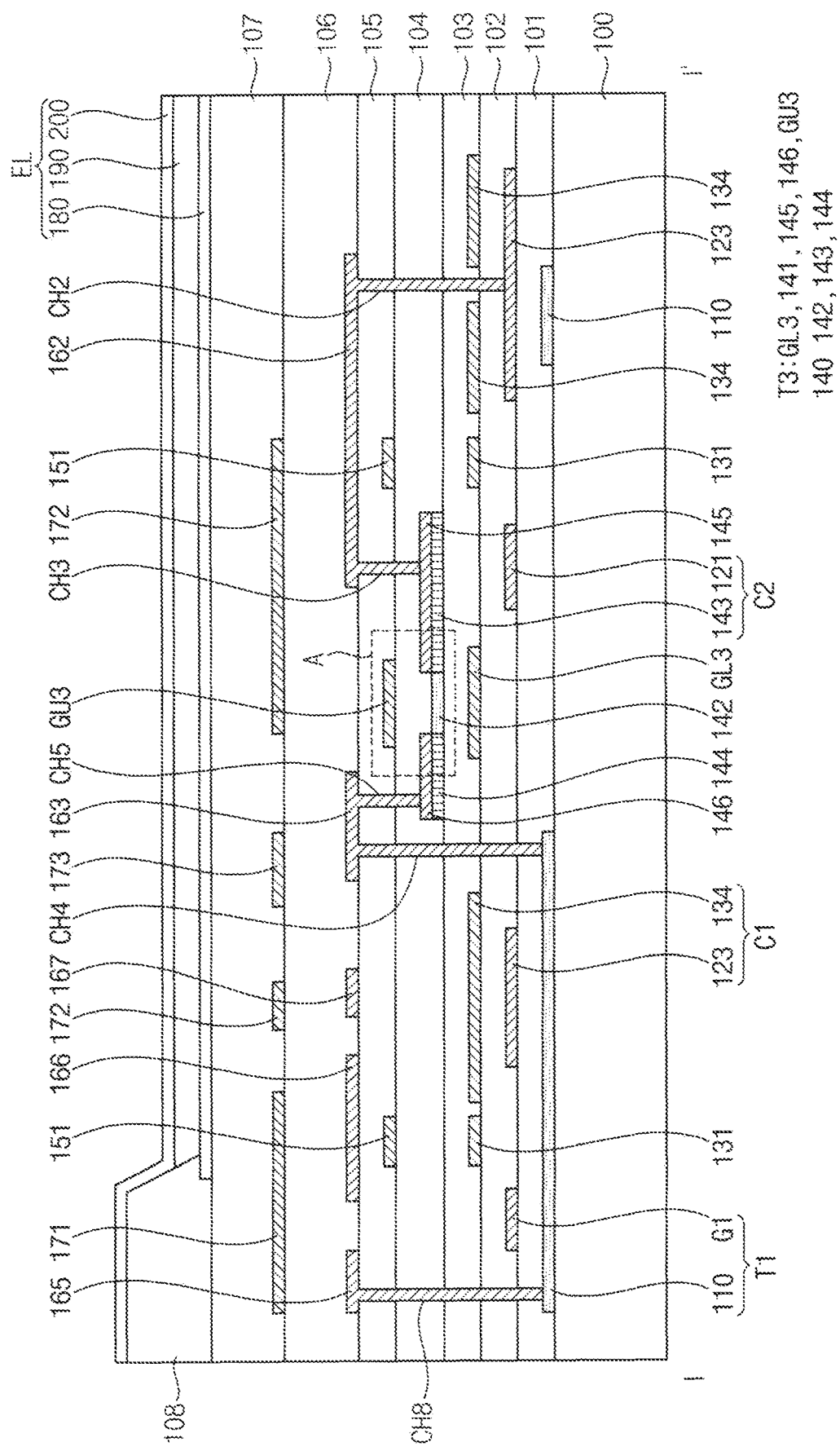
FIG. 16 is a sectional view taken along line I-I' of FIG. 13.
Figure 17:
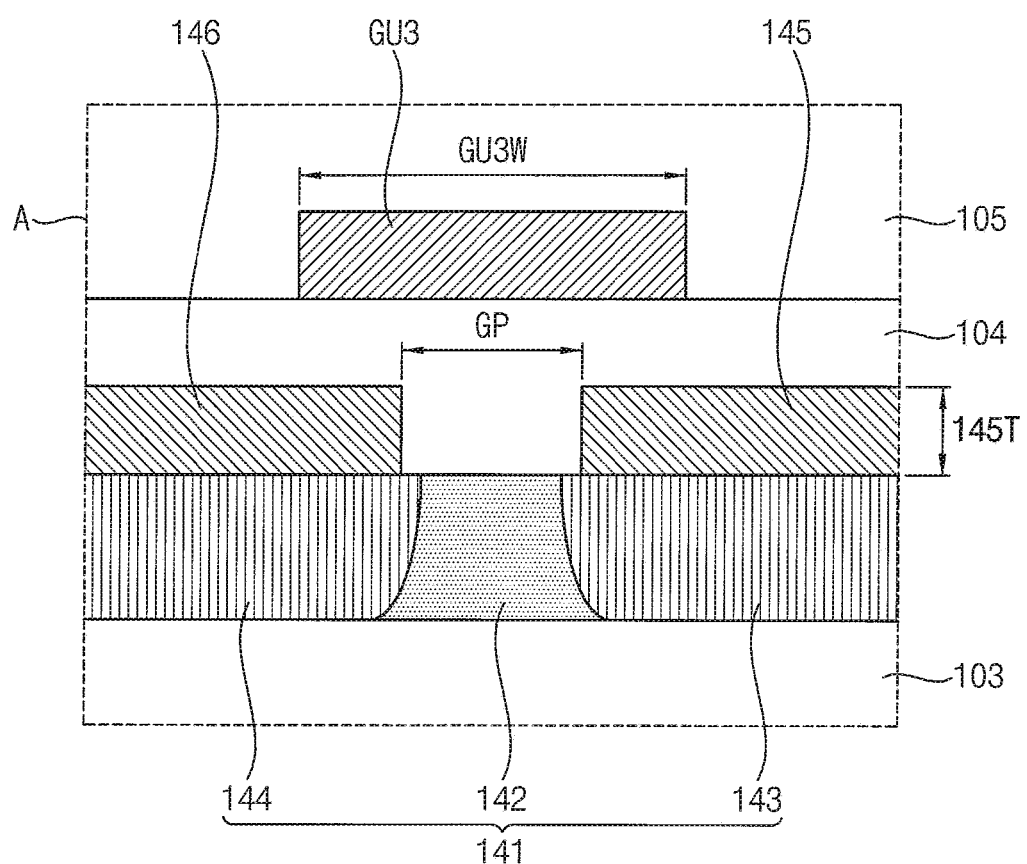
FIG. 17 is a sectional view showing 'A' region of FIG. 16.

FIGS. 3, 4, 5, 6, 7, 8, 9, 10, 11, 12, 13, 14, and 15 are layout views showing the pixel PX of FIG. 2. FIG. 16 is a sectional view taken along line I-I' of FIG. 13. FIG. 17 is a sectional view showing 'A' region of FIG. 16.

Referring to FIGS. 2 to 17, the pixel PX may include a first active layer 110 disposed on a substrate 100, a first conductive layer 120, a second conductive layer 130, a second active layer 140, a third conductive layer 150, a fourth conductive layer 160, a fifth conductive layer 170, a first electrode 180, a light emitting layer 190, and a second electrode 200.

The substrate 100 may be an insulating substrate including glass, quartz, plastic, or the like. In one embodiment, the substrate 100 may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulating material such as polyimide (PI), and the first barrier layer and the second barrier layer may include an inorganic insulating material such as silicon oxide, silicon nitride, and amorphous silicon.

The first active layer 110 may be disposed on the substrate 100. The first active layer 110 may include a patterned polycrystalline silicon. The patterned polycrystalline silicon may be formed of a semiconductive material, for example, polycrystalline silicon.

A buffer layer may be disposed between the substrate 100 and the first active layer 110. The buffer layer may prevent impurities such as oxygen and moisture from diffusing into an upper portion of the substrate 100 through the substrate 100. In addition, the buffer layer may provide a flat top surface on the upper portion of the substrate 100. The buffer layer may include an inorganic insulating material such as silicon oxide, silicon nitride, and silicon oxynitride. The buffer layer may be omitted.

The first conductive layer 120 may be disposed on the first active layer. The first conductive layer 120 may include a conductive material such as molybdenum (Mo) and copper (Cu).

A first insulating layer 101 may be disposed between the first active layer and the first conductive layer 120. The first insulating layer 101 may include an inorganic insulating material such as silicon oxide, silicon nitride, and silicon oxynitride.

The first conductive layer 120 may include a scan line 121, an emission control signal line 122, and a first conductive pattern 123. The scan line 121 may extend in the first direction DR1. The emission control signal line 122 may extend in the first direction DR1 while being spaced apart from the scan line 121. The first conductive pattern 123 may be located between the scan line 121 and the emission control signal line 122.

A first portion of the scan line 121 that overlaps the first active layer 110 may form a gate electrode G2 of the switching transistor T2, and a second portion of the scan line 121 that overlaps the first active layer 110 may form a gate electrode G7 of the second initialization transistor T7. Meanwhile, a first portion of the first active layer 110 that overlaps the gate electrode G2 of the switching transistor T2 may be a channel of the switching transistor T2, and a second portion of the first active layer 110 that overlaps the gate electrode G7 of the second initialization transistor T7 may be a channel of the second initialization transistor T7. Accordingly, the first active layer 110 and the gate electrode G2 may form the switching transistor T2, and the first active layer 110 and the gate electrode G7 may form the second initialization transistor T7.

A first portion of the emission control signal line 122 that overlaps the first active layer 110 may form a gate electrode G5 of the first emission control transistor T5, and a second portion of the emission control signal line 122 that overlaps the first active layer 110 may form a gate electrode G6 of the second emission control transistor T6. Meanwhile, a third portion of the first active layer 110 that overlaps the gate electrode G5 of the first emission control transistor T5 may be a channel of the first emission control transistor T5, and a fourth portion of the first active layer 110 that overlaps the gate electrode G6 of the second emission control transistor T6 may be a channel of the second emission control transistor T6. Accordingly, the first active layer 110 and the gate electrode G5 may form the first emission control transistor T5, and the first active layer 110 and the gate electrode G6 may form the second emission control transistor T6.

A portion of the first conductive pattern 123 that overlaps the first active layer 110 may form a gate electrode G1 of the driving transistor T1. Meanwhile, a fifth portion of the first active layer 110 that overlaps the gate electrode G1 of the driving transistor T1 may be a channel of the driving transistor T1. Accordingly, the first active layer 110 and the gate electrode G1 may form the driving transistor T1.

The second conductive layer 130 may be disposed on the first conductive layer 120. The second conductive layer 130 may include a conductive material such as molybdenum (Mo) and copper (Cu).

A second insulating layer 102 may be disposed between the first conductive layer 120 and the second conductive layer 130. The second insulating layer 102 may include an inorganic insulating material such as silicon oxide, silicon nitride, and silicon oxynitride.

The second conductive layer 130 may include a first lower gate signal line 131, a second lower gate signal line 132, a first initialization voltage line 133, and a second conductive pattern 134. The first lower gate signal line 131 may extend in the first direction DR1. The second lower gate signal line 132 may extend in the first direction DR1 while being spaced apart from the first lower gate signal line 131. The first initialization voltage line 133 may extend in the first direction DR1 while being spaced apart from the second lower gate signal line 132. The second conductive pattern 134 may extend in the first direction DR1 while being spaced apart from the first lower gate signal line 131.

The second conductive pattern 134 may overlap the first conductive pattern 123. The first conductive pattern 123 and the second conductive pattern 134 may form the storage capacitor C1.

The second active layer 140 may be disposed on the second conductive layer 130.

A third insulating layer 103 may be disposed between the second conductive layer 130 and the second active layer 140. The third insulating layer 103 may include an inorganic insulating material such as silicon oxide, silicon nitride, and silicon oxynitride.

The second active layer 140 may include an oxide semiconductor pattern 141 and metal patterns 145 and 146. The oxide semiconductor pattern 141 may be formed of an oxide semiconductor including indium (In), zinc (Zn), gallium (Ga), tin (Sn), titanium (Ti), aluminum (Al), hafnium (Hf), zirconium (Zr), magnesium (Mg), and the like. For example, the oxide semiconductor pattern 141 may include indium gallium zinc oxide (IGZO), indium tin zinc oxide (ITZO), indium zinc oxide (IZO), zinc magnesium oxide, zinc tin oxide (ZTO), zinc zirconium oxide, zinc oxide, gallium oxide, tin oxide, indium oxide, indium gallium hafnium oxide, tin aluminum zinc oxide, indium tin gallium oxide (ITGO), and the like.

The oxide semiconductor pattern 141 may include a channel 142 and low-resistance parts 143 and 144 formed on a side portion of the channel 142. In one embodiment, the low-resistance parts 143 and 144 may include a first low-resistance part 143 formed on a first side of the channel 142 and a second low-resistance part 144 formed on a second side of the channel 142 and spaced apart from the first side portion of the channel 142 with the channel 142 interposed therebetween.

The first low-resistance part 143 may overlap the scan line 121. The scan line 121 and the first low-resistance part 143 may form the boost capacitor C2.

In one embodiment, an oxygen content of the low-resistance parts 143 and 144 may be less than an oxygen content of the channel 142. In addition, the low-resistance parts 143 and 144 may include oxygen vacancy greater than oxygen vacancy of the channel 142. Since the oxygen vacancy may function as a carrier through which an electric charge moves, the low-resistance parts 143 and 144 may have a relatively low resistance.

The metal patterns 145 and 146 may be disposed on at least one surface of the low-resistance parts 143 and 144, respectively. In one embodiment, the metal patterns 145 and 146 may include a first metal pattern 145 disposed on at least one surface of the first low-resistance part 143 and a second metal pattern 146 disposed on at least one surface of the second low-resistance part 144.

In one embodiment, the metal patterns 145 and 146 may be disposed on top surfaces of the low-resistance parts 143 and 144, respectively. For example, the low-resistance parts 143 and 144 may be disposed on a top surface of the third insulating layer 103, and the metal patterns 145 and 146 may be disposed on the top surfaces of the low-resistance parts 143 and 144, respectively. In this case, the metal patterns 145 and 146 may not be disposed on a top surface of the channel 142.

The metal patterns 145 and 146 may make direct contact with the at least one surface of the low-resistance parts 143 and 144, respectively. In other words, the metal patterns 145 and 146 may be disposed directly on the at least one surface of the low-resistance parts 143 and 144, respectively.

Oxygen atoms or oxygen ions may move from the second active layer 140 to the metal patterns 145 and 146. As the oxygen atoms or the oxygen ions move from the oxide semiconductor pattern 141 in the second active layer 140 to the metal patterns 145 and 146, the oxygen vacancy of the low-resistance parts 143 and 144 may be increased, and the low-resistance parts 143 and 144 may include the oxygen vacancy greater than the oxygen vacancy of the channel 142.

Each of the metal patterns 145 and 146 may include at least one of tungsten (W), titanium (Ti), molybdenum (Mo), aluminum (Al), tantalum (Ta), and nitride thereof. Since each of the metal patterns 145 and 146 include the above material, the oxygen atoms or the oxygen ions may move from the oxide semiconductor pattern 141 to the metal patterns 145 and 146.

In a comparative example in which the second active layer does not include a metal pattern, since the oxide semiconductor pattern may include relatively less oxygen vacancy, the oxide semiconductor pattern may have a relatively high resistance. Accordingly, an ON-state current of the compensation transistor including the oxide semiconductor pattern may be reduced. However, in embodiments of the present inventive concept, since the metal patterns 145 and 146 are disposed on the low-resistance parts 143 and 144 of the oxide semiconductor pattern 141, respectively, the low-resistance parts 143 and 144 may include relatively large oxygen vacancy, and the low-resistance parts 143 and 144 may have a relatively low resistance. Accordingly, the ON-state current of the compensation transistor T3 including the oxide semiconductor pattern 141 may be prevented from being reduced.

In one embodiment, as disclosed in FIG. 17, a gap GP between the first metal pattern 145 and the second metal pattern 146 may be smaller than a width GU3W of an upper gate electrode GU3. Since the gap GP between the first metal pattern 145 disposed on the at least one surface of the first low-resistance part 143 and the second metal pattern 146 disposed on the at least one surface of the second low-resistance part 144 is smaller than the width GU3W of the upper gate electrode GU3, a length of the channel 142 located between the first low-resistance part 143 and the second low-resistance part 144 may be smaller than the width GU3W of the upper gate electrode GU3.

In one embodiment, the gap GP between the first metal pattern 145 and the second metal pattern 146 may be greater than about 0.1 μm. Since the oxygen atoms or the oxygen ions move from the low-resistance parts 143 and 144 to the metal patterns 145 and 146 through interfaces between the low-resistance parts 143 and 144 and the metal patterns 145 and 146, the oxygen vacancy may expands into the low-resistance parts 143 and 144 from the interfaces between the low-resistance parts 143 and 144 and the metal patterns 145 and 146. Meanwhile, since the oxygen vacancy expands from an end of the first metal pattern 145 and an end of the second metal pattern 146 which face each other toward the channel 142 by about 0.05 μm in a horizontal direction, the width of the channel 142 may be smaller than the gap GP between the first metal pattern 145 and the second metal pattern 146 by about 0.1 μm. Since the gap GP between the first metal pattern 145 and the second metal pattern 146 is greater than about 0.1 μm, the channel 142 may be formed between the first low-resistance part 143 and the second low-resistance part 144.

In one embodiment, a thickness 145T of each of the metal patterns 145 and 146 may be about 50 Å or more and about 1000 Å or less. When the thickness 145T of each of the metal patterns 145 and 146 is less than about 50 Å, oxygen atoms or oxygen ions may not sufficiently diffuse from the low-resistance parts 143 and 144 to the metal patterns 145 and 146 so that the low-resistance parts 143 and 144 may not include sufficient oxygen vacancy. In addition, when the thickness 145T of each of the metal patterns 145 and 146 is greater than about 1000 Å, dispersion of the gap GP between the first metal pattern 145 and the second metal pattern 146 may be increased in a process of forming the metal patterns 145 and 146 through dry etching.

The third conductive layer 150 may be disposed on the second active layer 140. The third conductive layer 150 may include a conductive material such as molybdenum (Mo) and copper (Cu).

A fourth insulating layer 104 may be disposed between the second active layer 140 and the third conductive layer 150. The fourth insulating layer 104 may include an inorganic insulating material such as silicon oxide, silicon nitride, and silicon oxynitride.

The third conductive layer 150 may include a first upper gate signal line 151 and a second upper gate signal line 152. The first upper gate signal line 151 may extend in the first direction DR1. The second upper gate signal line 152 may extend in the first direction DR1 while being spaced apart from the first upper gate signal line 151.

A portion of the first lower gate signal line 131 that overlaps the second active layer 140 may form a lower gate electrode GL3 of the compensation transistor T3, and a portion of the first upper gate signal line 151 that overlaps the second active layer 140 may form an upper gate electrode GU3 of the compensation transistor T3. Meanwhile, a first portion of the second active layer 140 that overlaps the lower gate electrode GL3 and the upper gate electrode GU3 of the compensation transistor T3 may be a channel 142 of the compensation transistor T3. Accordingly, the lower gate electrode GL3, the oxide semiconductor pattern 141, the metal patterns 145 and 146, and the upper gate electrode GU3 may form the compensation transistor T3. The compensation transistor T3 may be a transistor having a dual gate structure.

A portion of the second lower gate signal line 132 that overlaps the second active layer 140 may form a lower gate electrode GL4 of the first initialization transistor T4, and a portion of the second upper gate signal line 152 that overlaps the second active layer 140 may form an upper gate electrode GU4 of the first initialization transistor T4. Meanwhile, a second portion of the second active layer 140 that overlaps the lower gate electrode GL4 and the upper gate electrode GU4 of the first initialization transistor T4 may be a channel of the first initialization transistor T4. Accordingly, the lower gate electrode GL4, the oxide semiconductor pattern 141, the metal patterns 145 and 146, and the upper gate electrode GLU4 may form the first initialization transistor T4. The first initialization transistor T4 may be a transistor having a dual gate structure.

The fourth conductive layer 160 may be disposed on the third conductive layer 150. The fourth conductive layer 160 may include a conductive material such as aluminum (Al), titanium (Ti), and copper (Cu). In one embodiment, the fourth conductive layer 160 may have a multilayer structure including a titanium layer, an aluminum layer, and a titanium layer that are stacked.

A fifth insulating layer 105 may be disposed between the third conductive layer 150 and the fourth conductive layer 160. The fifth insulating layer 105 may include an inorganic insulating material such as silicon oxide, silicon nitride, and silicon oxynitride, and/or an organic insulating material such as polyimide (PI).

The fourth conductive layer 160 may include a second initialization voltage line 161, a first connection pattern 162, a second connection pattern 163, a third connection pattern 164, a first contact pattern 165, a second contact pattern 166, and a third contact pattern 167. The second initialization voltage line 161 may extend in the first direction DR1. The second initialization voltage line 161 may be connected to the first active layer 110 through a first contact hole CH1. Accordingly, the second initialization voltage line 161 may be connected to the second initialization transistor T7.

The first connection pattern 162 may be spaced apart from the second initialization voltage line 161. The first connection pattern 162 may be connected to the first conductive pattern 123 through a second contact hole CH2, and may be connected to the second active layer 140 through a third contact hole CH3. In detail, the first connection pattern 162 may electrically connect the first conductive pattern 123 to the first low-resistance part 143 of the oxide semiconductor pattern 141. Accordingly, the first low-resistance part 143 may be electrically connected to the first conductive pattern 123 by the first connection pattern 162.

The second connection pattern 163 may be spaced apart from the first connection pattern 162. The second connection pattern 163 may be connected to the first active layer 110 through a fourth contact hole CH4, and may be connected to the second active layer 140 through a fifth contact hole CH5. In detail, the second connection pattern 163 may electrically connect the first active layer 110 to the second low-resistance part 144 of the oxide semiconductor pattern 141. Accordingly, the second low-resistance part 144 may be electrically connected to the first active layer 110 by the second connection pattern 163.

The third connection pattern 164 may be spaced apart from the second connection pattern 163. The third connection pattern 164 may be connected to the first initialization voltage line 133 through a sixth contact hole CH6, and may be connected to the second active layer 140 through a seventh contact hole CH7. Accordingly, the third connection pattern 164 may connect the first initialization voltage line 133 to the second active layer 140. The first initialization voltage line 133 may be electrically connected to the first initialization transistor T4 by the third connection pattern 164.

The first contact pattern 165 may be spaced apart from the third connection pattern 164. The first contact pattern 165 may be connected to the first active layer 110 through an eighth contact hole CH8. Accordingly, the first contact pattern 165 may be electrically connected to the switching transistor T2.

The second contact pattern 166 may be spaced apart from the first contact pattern 165. The second contact pattern 166 may be connected to the first active layer 110 through a ninth contact hole CH9, and may be connected to the second conductive pattern 134 through a tenth contact hole CH10. Accordingly, the second contact pattern 166 may be electrically connected to the first emission control transistor T5 and the storage capacitor C1.

The third contact pattern 167 may be spaced apart from the second contact pattern 166. The third contact pattern 167 may be connected to the first active layer 110 through an eleventh contact hole CH11. Accordingly, the third contact pattern 167 may be electrically connected to the second emission control transistor T6.

The fifth conductive layer 170 may be disposed on the fourth conductive layer 160. A sixth insulation layer 106 may be disposed between the fourth conductive layer 160 and the fifth conductive layer 170. The fifth conductive layer 170 may include a data line 171, a power supply voltage line 172, and a fourth contact pattern 173. The data line 171 may extend in the second direction DR2. The data line 171 may be connected to the first contact pattern 165 through a twelfth contact hole CH12. Accordingly, the data line 171 may be electrically connected to the switching transistor T2 by the first contact pattern 165.

The power supply voltage line 172 may extend in the second direction DR2 while being spaced apart from the data line 171. The power supply voltage line 172 may be connected to the second contact pattern 166 through a thirteenth contact hole CH13. Accordingly, the power supply voltage line 172 may be electrically connected to the first emission control transistor T5 and the storage capacitor C1 by the second contact pattern 166.

The fourth contact pattern 173 may be spaced apart from the power supply voltage line 172. The fourth contact pattern 173 may be electrically connected to the third contact pattern 167 through a fourteenth contact hole CH14.

The first electrode 180 may be disposed on the fifth conductive layer 170. The first electrode 180 may include a conductive material such as a metal, an alloy, and transparent conductive oxide. For example, the first electrode 180 may include silver (Ag), indium tin oxide (ITO), and the like. In one embodiment, the first electrode 180 may have a multilayer structure including an indium tin oxide layer, a silver layer, and an indium tin oxide layer that are stacked.

A seventh insulating layer 107 may be disposed between the fifth conductive layer 170 and the first electrode 180. The seventh insulating layer 107 may include an inorganic insulating material such as silicon oxide, silicon nitride, and silicon oxynitride, and/or an organic insulating material such as polyimide (PI).

The first electrode 180 may be connected to the fourth contact pattern 173 through a contact hole. Accordingly, the first electrode 180 may be electrically connected to the second emission control transistor T6 by the third contact pattern 167 and the fourth contact pattern 173.

An eighth insulating layer 108 may be disposed on the first electrode 180. The eighth insulating layer 108 may be disposed on the seventh insulating layer 107 to cover the first electrode 180. The eighth insulating layer 108 may have a pixel opening that exposes at least a part of the first electrode 180. In one embodiment, the pixel opening may expose a central portion of the first electrode 180, and the eighth insulating layer 108 may cover a peripheral portion of the first electrode 180. The eighth insulating layer 108 may include an organic insulating material such as polyimide (PI).

The light emitting layer 190 may be disposed on the first electrode 180. The light emitting layer 190 may be disposed on the first electrode 180 exposed by the pixel opening. The light emitting layer 190 may include at least one of an organic light emitting material and a quantum dot.

In one embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, and the like, and the high molecular weight organic compound may include poly(3,4-ethylenedioxythiophene), polyaniline, poly-phenylenevinylene, polyfluorene, and the like.

In one embodiment, the quantum dot may include a core including a group II-VI compound, a group III-V compound, a group IV-VI compound, a group IV element, a group IV compound, and a combination thereof. In one embodiment, the quantum dot may have a core-shell structure including a core and a shell surrounding the core. The shell may serve as a protective layer for maintaining semiconductor characteristics by preventing chemical modification of the core, and serve as a charging layer for imparting electrophoretic characteristics to the quantum dot.

The second electrode 200 may be disposed on the light emitting layer 190. In one embodiment, the second electrode 200 may also be disposed on the eighth insulating layer 108. The second electrode 200 may include a conductive material such as a metal, an alloy, and transparent conductive oxide. For example, the second electrode 200 may include aluminum (Al), platinum (Pt), silver (Ag), magnesium (Mg), gold (Au), chromium (Cr), tungsten (W), titanium (Ti), and the like. The first electrode 180, the light emitting layer 190, and the second electrode 200 may form the light emitting element EL.

Figure 18:
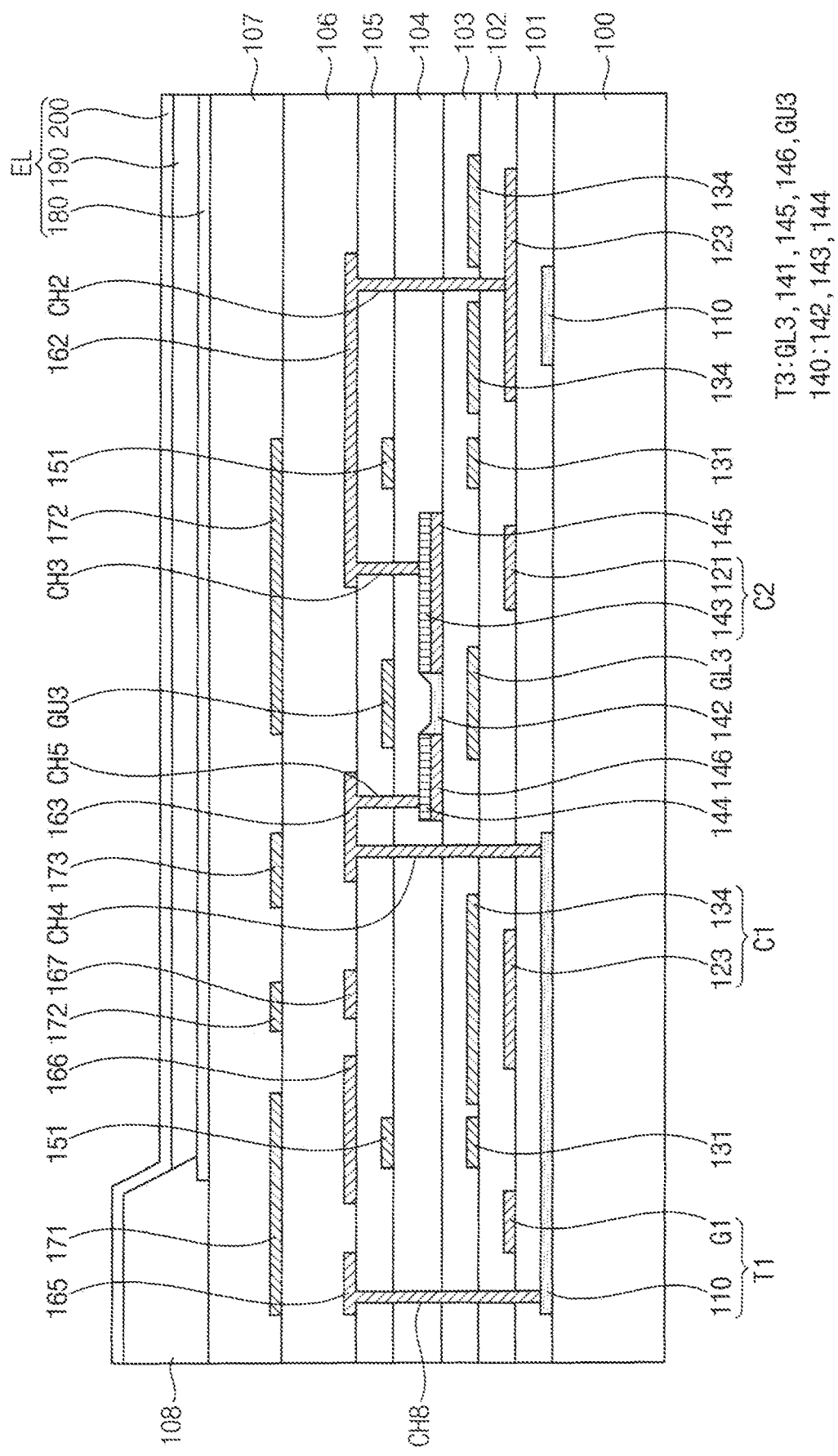
FIG. 18 is a sectional view showing a display device according to one embodiment of the present inventive concept.

FIG. 18 is a sectional view showing a display device according to one embodiment of the present inventive concept.

A display device that will be described with reference to FIG. 18 may be substantially identical or similar to the display device described with reference to FIGS. 1 to 17 except for positions of the metal patterns 145 and 146. Accordingly, descriptions of redundant components will be omitted.

Referring to FIG. 18, in one embodiment, the metal patterns 145 and 146 may be disposed on bottom surfaces of the low-resistance parts 143 and 144, respectively. For example, the metal patterns 145 and 146 may be disposed on the top surface of the third insulating layer 103, and the low-resistance parts 143 and 144 may be disposed on top surfaces of the metal patterns 145 and 146, respectively. In this case, the metal patterns 145 and 146 may not be disposed on a bottom surface of the channel 142.

Figure 20:
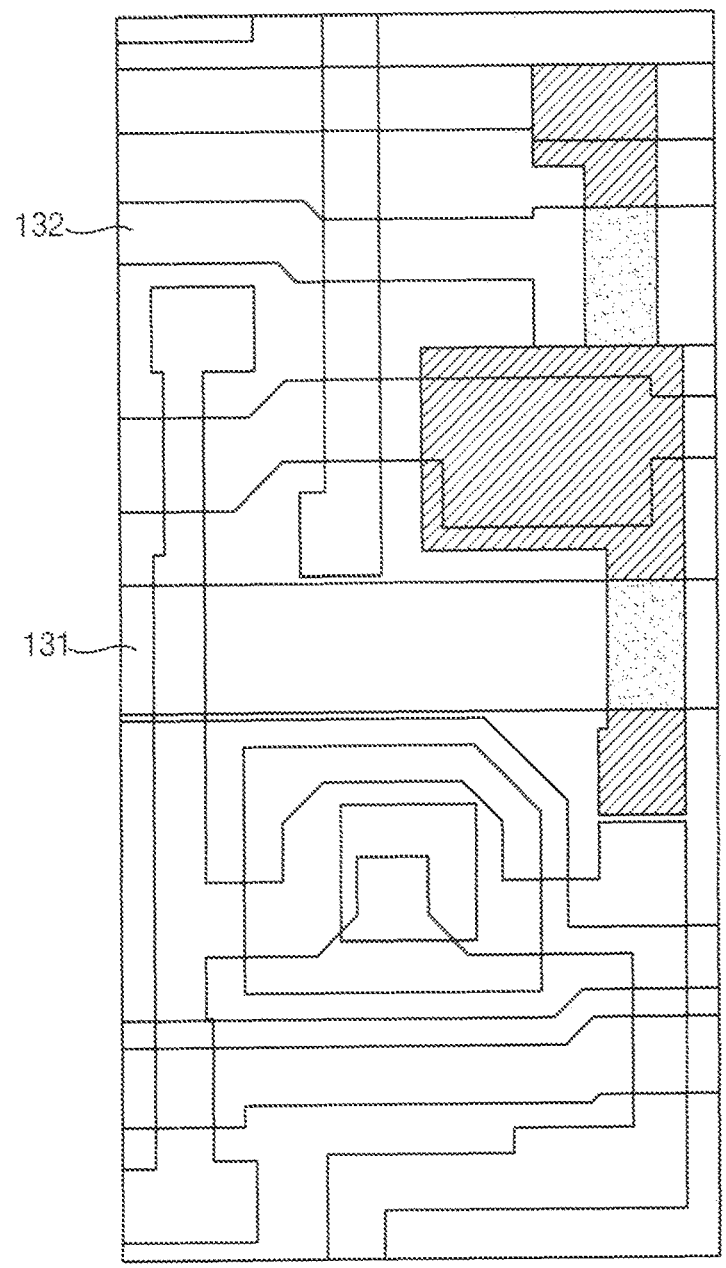

FIGS. 19 and 20 are layout views showing the pixel according to one embodiment of the present inventive concept. For example, FIGS. 19 and 20 may be views showing FIGS. 8 and 9 in detail, respectively.

Referring to FIGS. 19 and 20, the second active layer 140 may include: a channel 142 that overlaps the first and second lower gate signal lines 131 and 132; and a first low-resistance part 143, a second low-resistance part 144, a first metal pattern 145, and a second metal pattern 146 that do not overlap the first and second lower gate signal lines 131 and 132. The first low-resistance part 143 and the first metal pattern 145 may be disposed between a channel part 142 of the first initialization transistor T4 and a channel 142 of the compensation transistor T3 when viewed in a plan view. The second low-resistance part 144 and the second metal pattern 146 may be spaced apart from the first low-resistance part 143 and the first metal pattern 145 with the channel 142 interposed therebetween when viewed in a plan view. As shown in FIG. 16, the first metal pattern 145 and the second metal pattern 146 may be disposed on the top surface of the first low-resistance part 143 and the top surface of the second low-resistance part 144, respectively. Alternatively, as shown in FIG. 18, the first metal pattern 145 and the second metal pattern 146 may be disposed on the bottom surface of the first low-resistance part 143 and the bottom surface of the second low-resistance part 144, respectively.

Figure 21:
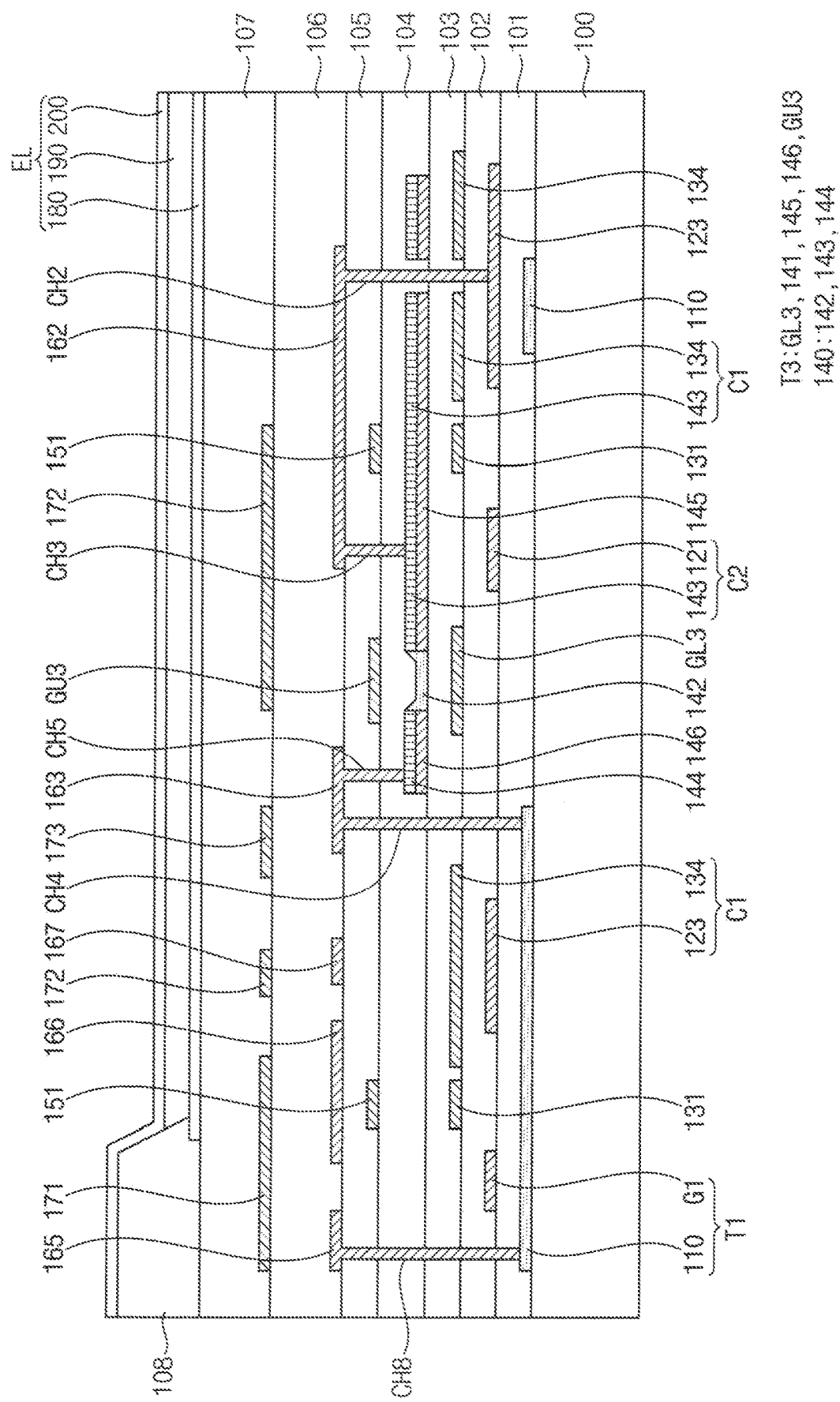
FIG. 21 is a sectional view showing a display device according to one embodiment of the present inventive concept.

FIG. 21 is a sectional view showing a display device according to one embodiment of the present inventive concept.

A display device that will be described with reference to FIG. 21 may be substantially identical or similar to the display device described with reference to FIG. 18 except for shapes of the first low-resistance part 143 and the first metal pattern 145. Accordingly, descriptions of redundant components will be omitted.

Referring to FIG. 21, in one embodiment, the first low-resistance part 143 and the first metal pattern 145 may extend to overlap the second conductive pattern 134. Since the first low-resistance part 143 is electrically connected to the first conductive pattern 123 through the first connection pattern 162, the second conductive pattern 134 and the first low-resistance part 143 may form the storage capacitor C1. Accordingly, a capacitance of the storage capacitor C1 may be increased.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a first active layer disposed on a substrate;
a scan line disposed on the first active layer;
a lower gate electrode disposed on the scan line;
a second active layer disposed on the lower gate electrode, the second active layer including an oxide semiconductor pattern that includes a channel overlapping the lower gate electrode and a low-resistance part formed on a side portion of the channel;
a metal pattern disposed on at least one surface of the low-resistance part; and
an upper gate electrode disposed on the second active layer to overlap the channel,
wherein the low-resistance part is electrically connected to the first active layer.

2. The display device of claim 1, wherein the metal pattern makes direct contact with the at least one surface of the low-resistance part.

3. The display device of claim 1, wherein the scan line and the low-resistance part form a boost capacitor.

4. The display device of claim 1, wherein the metal pattern includes at least one of tungsten (W), titanium (Ti), molybdenum (Mo), aluminum (Al), tantalum (Ta), and a nitride thereof.

5. The display device of claim 1, wherein the metal pattern includes oxygen atoms or oxygen ions diffused from the oxide semiconductor pattern.

6. The display device of claim 1, wherein an oxygen content of the low-resistance part is smaller than an oxygen content of the channel.

7. The display device of claim 1, wherein a thickness of the metal pattern is about 50 Å or more and about 1000 Å or less.

8. The display device of claim 1, wherein the metal pattern is disposed on a top surface of the low-resistance part.

9. The display device of claim 1, wherein the metal pattern is disposed on a bottom surface of the low-resistance part.

10. The display device of claim 1, wherein the low-resistance part includes:
a first low-resistance part formed on a first side portion of the channel; and
a second low-resistance part formed on a second side portion of the channel which is spaced apart from the first side portion of the channel with the channel interposed therebetween, and
wherein the metal pattern includes:
a first metal pattern disposed on at least one surface of the first low-resistance part; and
a second metal pattern disposed on at least one surface of the second low-resistance part.

11. The display device of claim 10, further comprising a first conductive pattern disposed on a same layer as the scan line to form a driving transistor together with the first active layer.

12. The display device of claim 11, wherein the first low-resistance part is electrically connected to the first conductive pattern.

13. The display device of claim 11, further comprising a second conductive pattern disposed on a same layer as the lower gate electrode to form a storage capacitor together with the first conductive pattern.

14. The display device of claim 13, wherein the first low-resistance part extends to overlap the second conductive pattern, and the second conductive pattern and the first low-resistance part form the storage capacitor.

15. The display device of claim 10, wherein the second low-resistance part is electrically connected to the first active layer.

16. The display device of claim 10, wherein a gap between the first metal pattern and the second metal pattern is smaller than a width of the upper gate electrode.

17. The display device of claim 16, wherein the gap between the first metal pattern and the second metal pattern is greater than 0.1 μm.

* * * * *